(12) United States Patent
Nakajima

(10) Patent No.: US 6,541,348 B1
(45) Date of Patent: Apr. 1, 2003

(54) SEMICONDUCTOR DEVICE AND MANUFACTURING METHOD THEREOF

(75) Inventor: Hiroomi Nakajima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/061,309

(22) Filed: Feb. 4, 2002

(30) Foreign Application Priority Data

Dec. 4, 2001 (JP) ........................................ 2001-370243

(51) Int. Cl.$^7$ ........................ H01L 21/76; H01L 21/332
(52) U.S. Cl. ........................ 438/407; 438/412; 438/473; 257/66
(58) Field of Search ................................ 438/143, 149, 438/407, 412, 471, 473; 257/66

(56) References Cited

U.S. PATENT DOCUMENTS

| | | | | |
|---|---|---|---|---|
| 6,271,541 | B2 | * 7/2001 | Yamaguchi et al. | ........... 257/66 |
| 6,368,938 | B1 | * 4/2002 | Usenko | ...................... 438/407 |
| 6,399,460 | B1 | * 6/2002 | Yamaguchi et al. | ......... 438/412 |
| 2001/0002704 | A1 | * 6/2001 | Yamaguchi et al. | ........... 257/66 |

FOREIGN PATENT DOCUMENTS

| | | | |
|---|---|---|---|
| JP | 9-139434 | 5/1997 | |
| JP | 10-189959 | 7/1998 | |
| JP | 2001-024200 | * 1/2001 | ......... H01L/29/786 |
| TW | 439112 A | * 6/2001 | ............ H01I/21/02 |

OTHER PUBLICATIONS

Terukazu Ohno, et al., "Suppression of the Parasitic Bipolar Effect in Ultra–Thin–Film nMOSFETs/SIMOX by Ar Ion Implantation into Source/Drain Regions", IEDM, 1995 IEEE, pp. 627–630.

* cited by examiner

Primary Examiner—Chandra Chaudhari
Assistant Examiner—David S Blum
(74) Attorney, Agent, or Firm—Oblon, Spivak, McClelland, Maier & Neustadt, P.C.

(57) ABSTRACT

Gettering layers are formed near element isolation insulating films in an active layer on a buried oxide film. The gettering layers trap mainly heavy metals diffused from the element isolation insulating films into the active layer.

19 Claims, 5 Drawing Sheets

SEMICONDUCTOR DEVICE AND MANUFACTURING METHOD THEREOF

CROSS-REFERENCE TO RELATED APPLICATION

This application is based upon and claims the benefit of priority from the prior Japanese Patent Application No. 2001-370243, filed Dec. 4, 2001, the entire contents of which are incorporated herein by reference.

BACKGROUND OF THE INVENTION

1. Field of the Invention

This invention relates to a semiconductor device using, for example, an SOI (Silicon On Insulator) substrate and a manufacturing method thereof.

2. Description of the Related Art

In recent years, semiconductor integrated circuits have been required to consume less power and operate at higher speed. To achieve this, they have been required to operate on lower power supply voltages and have their element made finer. In this connection, SOI elements with the advantages of low parasitic capacitance and low sub-threshold coefficients have been attracting attention in place of conventional bulk elements.

In a MOS semiconductor device formed in a semiconductor layer on an insulator (hereinafter, referred to as an SOI-MOS), elements are isolated from one another by the insulating film. In contrast, in a bulk MOS semiconductor device directly formed on a semiconductor substrate, elements are isolated from one another by junction isolation. As described above, the SOI-MOS semiconductor device differs from the bulk MOS semiconductor device in configuration.

FIG. 12 shows the configuration of a general SOI-MOS. A buried oxide film 2 is formed on a silicon substrate 1 constituting an SOI substrate. On the buried oxide film 2, a semiconductor layer 3 is formed. In the semiconductor layer 3, a buried element isolation insulating film 4 made by, for example, STI (Shallow Trench Isolation). The element isolation insulating film 4 separates the semiconductor layer 3 into parts. At the surface of each separate semiconductor layer 3, a gate oxide film 5 is formed. On the gate oxide film 5, a gate electrode 6 is formed. In the semiconductor layer 3 on both sides of the gate electrode 6, source/drain regions 7 are formed. An interlayer insulating film 8 is formed on the entire surface of the SOI substrate. In the interlayer insulating film 8, gate electrodes 6 and a plurality of contacts 9 connected to the source-drain regions 7 are formed. On the interlayer insulating film 8, for example, aluminum wires 10 connected in a one-to-one correspondence to the contacts 9 are formed.

To form a mesa isolation structure made of the element isolation insulating film 4 in the SOI-MOS, a resist pattern is first formed on the semiconductor layer 3 by using lithographic techniques. With the resist patter as a mask, the semiconductor layer 3 is processed precisely, thereby producing a mesa isolation structure. The mesa isolation structure can be formed easily by using general semiconductor manufacturing processes. Therefore, the mesa isolation structure is suitable for a method of isolating elements from one another in a micro-fabricated SOI-MOS.

In the SOI-MOS with the above structure, the elements can be isolated completely. Thus, when a CMOS is configured using an SOI-MOS, a parasitic thyristor is not formed, even when the n-type region is brought close to the p-type region. As a result, not only can "latch up" be prevented from occurring, but also the floating capacitance can be reduced. This makes it possible to provide a highly reliable semiconductor device.

Since the SOI-MOS has the above advantages, it has lately attracted attention. It is known that, when the semiconductor layer 3 is thinned to a thickness of about 0.1 $\mu$m and thin source/drain regions are formed in the semiconductor layer 3, the effect of its shape not only improves the current driving force of the SOI-MOS but also reduces the short channel effect. Consequently, the SOI-MOS is expected to be a basic structure for transistors of submicron order.

When the SOI-MOS with the above structure is formed, for example, crystal defects occur in the semiconductor layer 3. In addition, the SOI-MOS uses buried element isolation insulating films 4 made of, for example, TEOS. As a result, in the semiconductor layer 3, heavy metals acting as contaminant impurities are diffused from the element isolation insulating film 4. In the case of a bulk substrate, crystal defects and heavy metals can be removed by gettering from the back of the substrate. Since the SOI-MOS uses an SOI substrate having a buried oxide film 2, it is impossible to use a method of gettering from the back of the substrate as in the bulk substrate. This raises the subject of how to improve the reliability of the SOI-MOS.

BRIEF SUMMARY OF THE INVENTION

According to an aspect of the present invention, there is provided a semiconductor device comprising: a semiconductor layer formed on a buried insulating layer on a semiconductor substrate; a plurality of element isolation insulating films which are formed in the semiconductor layer and which separate the semiconductor layer into parts; a gate insulating film formed on the semiconductor layer; a gate electrode formed on the gate insulating film; diffused layers serving as source/drain regions formed in the semiconductor layer on both sides of the gate electrode; and gettering layers formed near the element isolation insulating films in the diffused layers.

DETAILED DESCRIPTION OF THE INVENTION

Hereinafter, referring to the accompanying drawings, an embodiment of the present invention will be explained.

Figure 1:
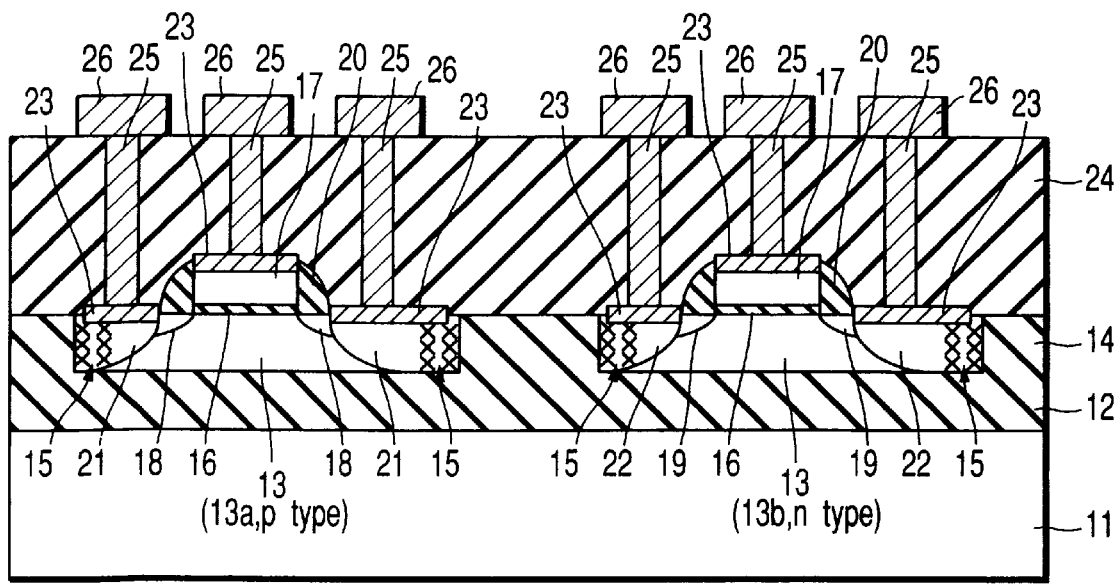
FIG. 1 is a sectional view of a semiconductor device according to an embodiment of the present invention.

FIG. 1 shows an SOI-MOS according to an embodiment of the present invention, such as a p-channel MOS transistor and an n-channel MOS transistor. In FIG. 1, a buried oxide film (or buried insulating film) 12 is formed on a support substrate (or semiconductor substrate) 11 constituting an SOI substrate. On the buried oxide film 12, an active layer 13 serving as an element forming layer is formed. In the active layer 13, a buried element isolation insulating film 14 is formed as STI. The element isolation insulating film 14 is in contact with the buried oxide film 12. The individual active layers 13 are separated from one another by the element isolation insulating film 14 and buried oxide film 12. FIG. 1 shows a p-channel MOS transistor and an n-channel MOS transistor. Into an active layer 13a, for example, p-type impurities are introduced. Into an active layer 13b, for example, n-type impurities are introduced.

On each of the active layers 13a, 13b, a gate oxide film (or gate insulating film) 16 is formed. On the gate oxide film 16, a gate electrode 17 made of, for example, polysilicon, is formed. In the active layer 13a on both sides of the gate electrode 17, n-type LDD (Lightly Doped Drain) regions 18 serving as extension regions are formed. In the active layer 13b on both sides of the gate electrode 17, p-type LDD regions 19 are formed.

On the sidewall of the gate electrode 17, a sidewall insulating film 20 is formed. In the active layer 13a on both sides of the sidewall insulating film 20, n-type source/drain regions 21 are formed. In the active layer 13b on both sides of the gate electrode 17, p-type source/drain regions 22 are formed. On each of the source/drain regions 21, 22 and gate electrodes 17, a silicide layer 23 made of, for example, titanium is formed.

An interlayer insulating film 24 is formed on the entire surface of the SOI substrate. In the interlayer insulating film 24, a plurality of contacts 25 to be brought into contact with the individual silicide layers 23 are formed. On the interlayer insulating film 24, a plurality of wires 26 made of, for example, aluminum to be connected to the individual contacts 25 are formed.

On the other hand, in each of the active layers 13a, 13b, a secondary defect layer 15 acting as a gettering layer is formed near the element isolation insulating films 14 on either side of the transistor in the direction of the channel. Here, a secondary defect, which differs from a primary defect already present in the active layer 13, is a crystal defect foried by selectively implanting Si+ ions. These secondary defect layers 15 are located in the source/drain regions 21, 22. The secondary defect layers 15 trap heavy metals, contaminant impurities, diffused mainly from the element isolation insulating film 14 into the active layers 13a, 13b.

A method of manufacturing an SOI-MOS with the above configuration will be explained. In the figures below, the same parts as those in FIG. 1 are indicated by the same reference numerals.

Figure 2:
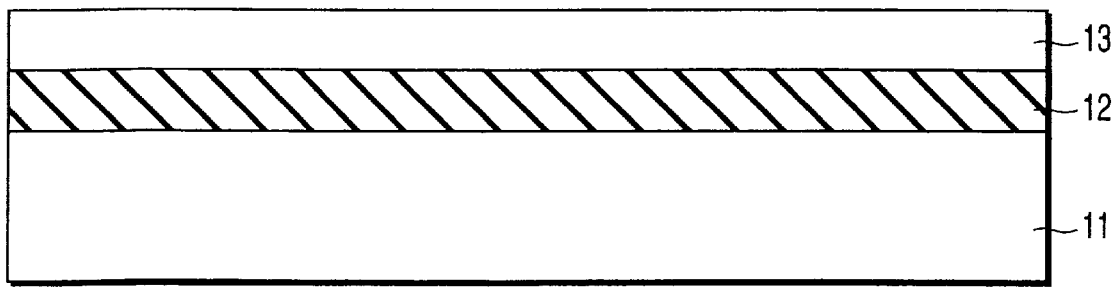
FIG. 2 is a sectional view to help explain a process of manufacturing the semiconductor device shown in FIG. 1.

FIG. 2 shows an SOI substrate. In the SOI substrate, a buried oxide film 12 is formed on a support substrate 11 made of silicon. On the buried oxide film 12, an active layer 13 made of, for example, a monocrystalline silicon serving as an element forming layer. The impurity concentration of the active layer 13 is set to, for example, $1\times10^{14}$ cm$^{-3}$.

Figure 3:
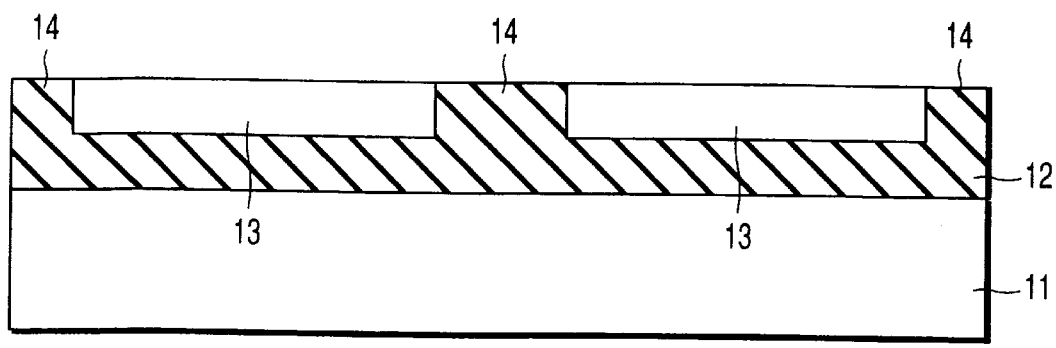
FIG. 3 is a sectional view to help explain a manufacturing process following FIG. 2.

First, as shown in FIG. 3, an element isolation insulating film 14 is formed in the active layer 13. That is, a mask material (not shown) is formed on the active layer 13. Using the mask material as a mask, the active layer 13 excluding the element regions is removed by, for example, RIE (Reactive Ion Etching) techniques, thereby forming trenches (not shown). On the entire surface of the structure formed as a result of the above process, a silicon oxide film is deposited by CVD (Chemical Vapor Deposition) techniques using, for example, TEOS. The silicon oxide film is flattened by, for example, CMP (Chemical Mechanical Polishing) techniques, thereby filling the trenches with the silicon oxide film. In this way, an element isolation insulating film 14 serving as STI is formed.

Figure 4:
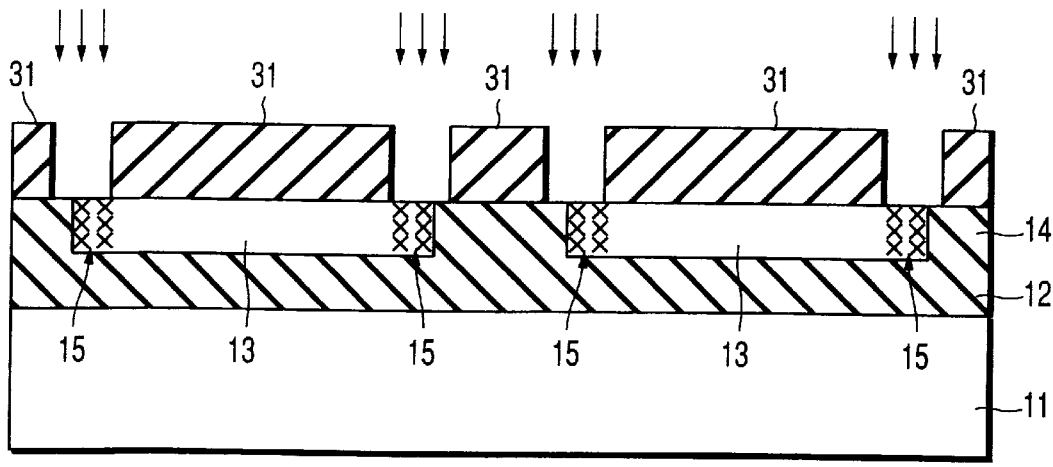
FIG. 4 is a sectional view to help explain a manufacturing process following FIG. 3.

Thereafter, as shown in FIG. 4, a resist pattern 31 is formed on the structure formed through the above processes. The resist pattern 31 has openings that expose part of the active layer 13 adjacent to the element isolation insulating film 14. With the resist pattern 31 as a mask, Si+ ions are implanted into part of the active layer 13. As a result of the ion implantation, many secondary defect layers 15 are formed in the active layer 13. The secondary defect layers 15 make first gettering layers that getter heavy metals, contaminant impurities, diffused in the active layers 13. The conditions for the implantation of Si+ are as follows: the dose is, for example, $1\times10^{15}$ cm$^{-2}$, the acceleration voltage is, for example, 100 KeV, for example, Rp=150 nm. The peak position of the concentration of silicon ions is set suitably so that it may lie in the interface between the active layer 13 and the buried oxide film 12.

Figure 5:
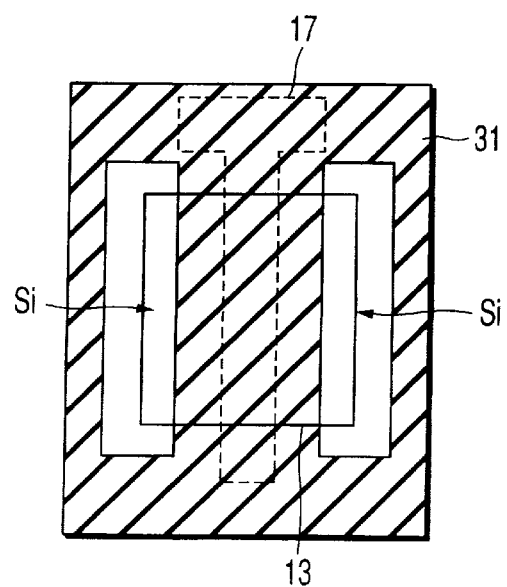
FIG. 5 is a plan view of a part of the resist pattern shown in FIG. 4.

FIG. 5 is a plan view of the resist pattern 31. When-the secondary defect layers 15 acting as the first gettering layers are formed, if ions are also implanted into the regions in which gate electrodes 17 are to be formed, this contributes to channel leaks. Therefore, it is necessary to prevent ions from being implanted into the regions where gate electrodes 17 are to be formed. Thus, the regions where gate electrodes 17 are to be formed are covered with the resist pattern 31.

Figure 6:
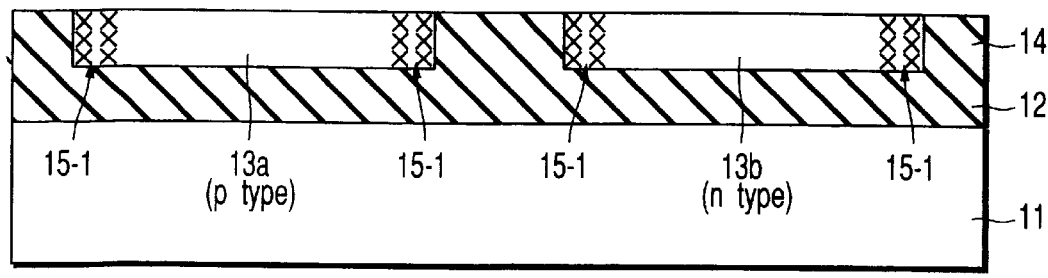
FIG. 6 is a sectional view to help explain a manufacturing process following FIG. 4.

Then, as shown in FIG. 6, after the resist pattern 31 is removed, the SOI substrate is heated to, for example, about 1100° C., thereby subjecting the element isolation insulating film 14 to densify annealing. At this time, heavy metals diffused from the element isolation insulating film 14 into the active layer 13 are trapped by the secondary defect layers 15 acting as the first gettering layers. As a result, the reliability of the gate oxide film formed after the trapping is improved. The densify annealing of the element isolation insulating film 14 remedies almost all of the secondary defects.

Next, as shown in FIG. 6, to getter reliably heavy metals diffused from the element isolation insulating film 14 in subsequent processes, secondary defect layers 15-1 are formed as second gettering layers. That is, the secondary defect layers 15-1 are formed as follows. A resist pattern (not shown) is formed in the same manner as described above. With this resist pattern as a mask, Si+ ions are implanted into part of the active layer 13, thereby forming the secondary defect layers 15-1. The conditions for the resist pattern and the ion implantation are the same as those for the first ion implantation. Thereafter, p-type impurities are introduced into the active layer 13a and n-type impurities are introduced into the active layer 13b, thereby forming channel regions.

Figure 7:
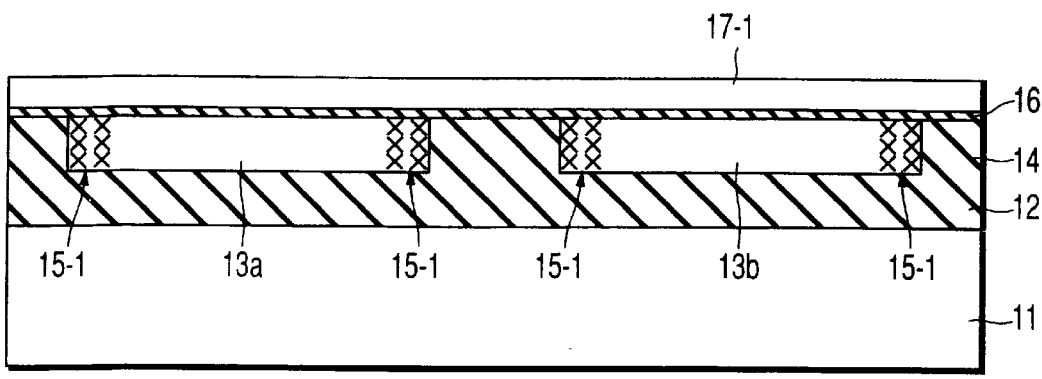
FIG. 7 is a sectional view to help explain a manufacturing process following FIG. 6.

Then, as shown in FIG. 7, a gate oxide film 16 is formed on the entire surface of the SOI substrate. On the gate oxide film 16, a polysilicon layer 17-1 is deposited to a thickness of, for example, about 300 nm.

Figure 8:
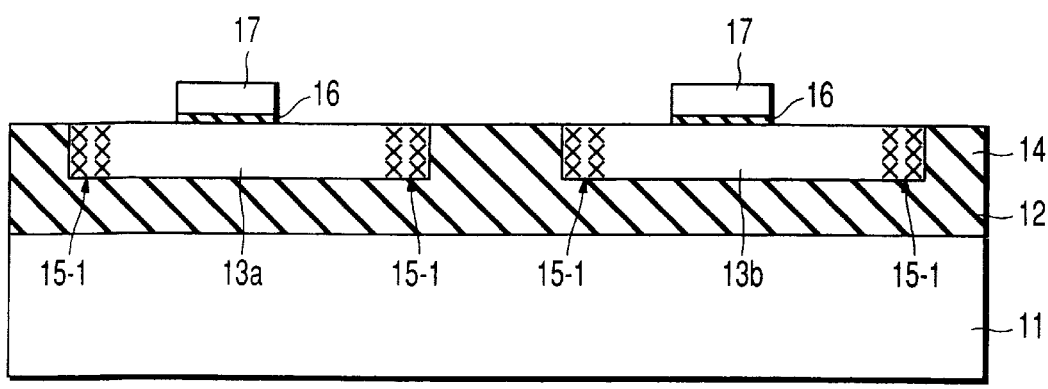
FIG. 8 is a sectional view to help explain a manufacturing process following FIG. 7.

Next, as shown in FIG. 8, using a specific mask material, the polysilicon layer 17-1 and gate oxide film 16 are etched by RIE techniques, thereby forming gate electrodes 17.

Figure 9:
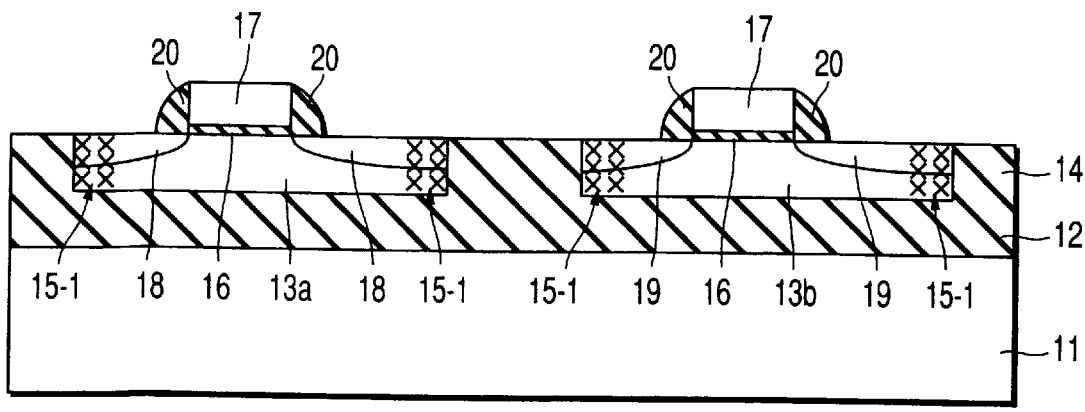
FIG. 9 is a sectional view to help explain a manufacturing process following FIG. 8.

Thereafter, as shown in FIG. 9, n-type impurity ions are implanted into the active layer 13a and p-type impurity ions are implanted into the active layer 13b. As a result, n-type LLD regions 18 are formed in the active layer 13a and p-type LDD regions 19 are formed in the active layer 13b. The LDD regions 18 are formed on both sides of the gate electrode 17. The LDD regions 19 are formed on both sides of the gate electrode 17.

Next, as shown in FIG. 9, a CVD oxide film (not shown) is deposited on the entire surface of the SOI substrate. The CVD oxide film is etched by RIE techniques, thereby forming a sidewall insulating film 20 on the sidewall of each gate electrode 17.

Figure 10:
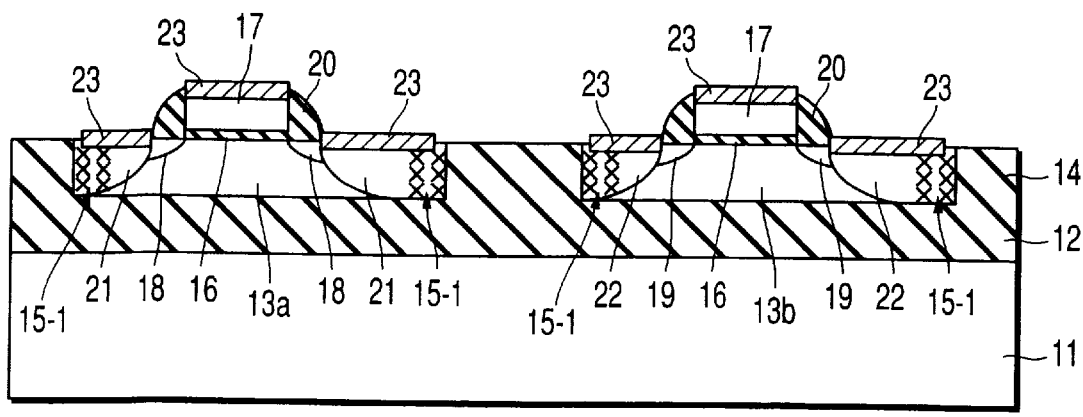
FIG. 10 is a sectional view to help explain a manufacturing process following FIG. 9.

Thereafter, as shown in FIG. 10, n-type impurity ions are implanted into the active layer 13a and p-type impurity ions are implanted into the active layer 13b. As a result, n-type source/drain regions 21 are formed in the active layer 13a and p-type source/drain regions 22 are formed in the active layer 13b. The source/drain regions 21 are formed on both sides of the sidewall insulating film 20. The source-drain regions 22 are formed on both sides of the sidewall insulating film 20. Thereafter, By a specific heating process, the LDD regions 18, 19 and source/drain regions 21, 22 in the MOS transistor are activated. At the same time, heavy metals are trapped by the secondary defect layers 15-1 serving as the second gettering layers.

Next, for example, Ti is spattered on the entire surface of the SOI substrate. Thereafter, Ti is caused to react with Si by heat treatment, thereby forming a silicide layer 23 on the source/drain regions 21, 22 and gate electrodes 17.

Thereafter, on the structure formed as the result of the above processes, an oxide film is deposited to a thickness of, for example, about 800 nm by LPCVD techniques, thereby forming the interlayer insulating film 24 shown in FIG. 1. Then, a plurality of contacts 25 that make contact with the source/drain regions and gate electrodes are formed in the interlayer insulating film 24. Furthermore, on the interlayer insulating film 24, an aluminum layer is spattered. The aluminum layer is patterned, thereby forming wires 26 to be connected to the corresponding contacts 25.

In this way, an SOI-MOS field effect transistor is formed. The SOI-MOS field effect transistor is, for example, a partial depletion transistor where the active layer 13 has a thickness of, for example, 140 to 180 nm and the source/drain regions 21, 22 are in contact with the buried oxide film 12.

The place in which the secondary defect layers 15, 15-1 acting as the first and second gettering layers are must be where h eavy metals diffused in the active layer 13 are trapped positively.

Figure 11:
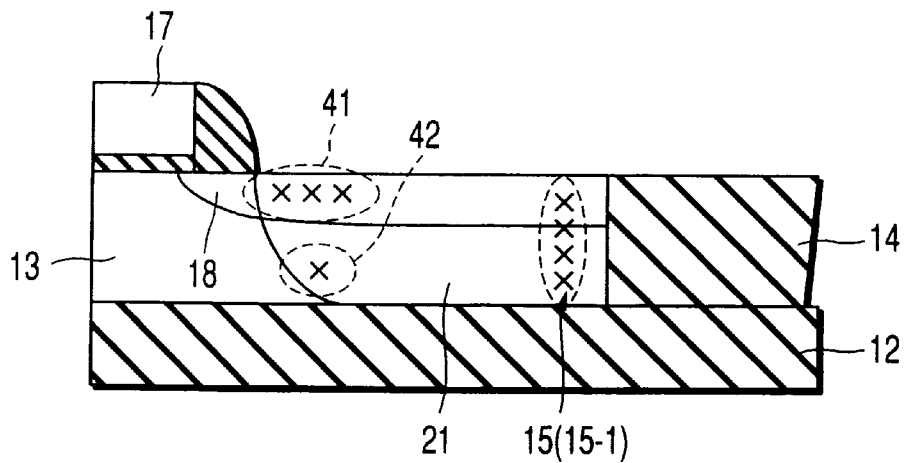
FIG. 11 is a sectional view of a main part to help explain the position where a gettering layer is to be formed.
Figure 12:
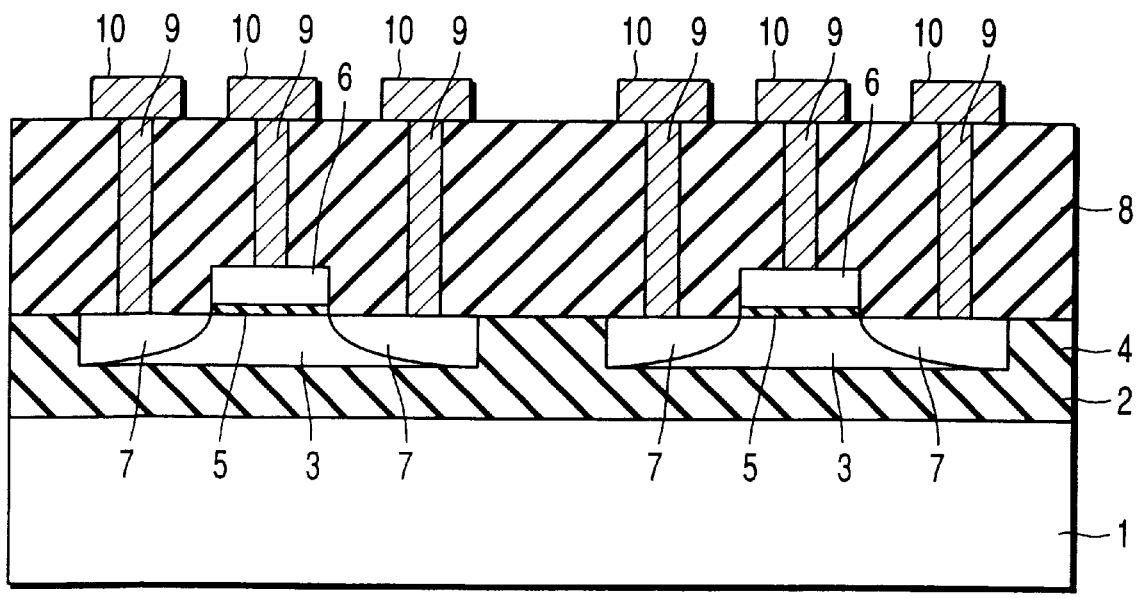
FIG. 12 is a sectional view of a general SOI-MOS semiconductor device.

FIG. 11 shows the place where the first gettering layer 15 is formed (the same holds true for the second gettering layer 15-1). In FIG. 11, the buried oxide film 12 is formed by, for example, thermal oxidation. As a result, the amount of heavy metals diffused from the buried oxide film 12 into the active layer 13 is small. On the other hand, the element isolation insulating film 14 is formed by CVD techniques using, for example, TEOS as described above. This permits the element isolation insulating film 14 to contain heavy metals, with the result that the heavy metals diffuse from the element isolation insulating film 14 into the active layer 13. The heavy meals diffused from the element isolation insulating film 14 into the active layer are distributed near the element isolation insulating film 14. Therefore, to trap the heavy metals efficiently, it is important to form the secondary defect layers 15, 15-1 acting as the first and second gettering layers near the element isolation insulating film 14 in the source-drain regions 21, 22 serving as diffused layers. Moreover, the secondary defect layers 15, 15-1 acting as the first and second gettering layers are formed preferably in such a manner that they extend from the top of the buried oxide film 12 close to the surface of the active layer 13 near the element isolation insulating film 14 in each of the source/drain regions 21, 22. This improves the gettering efficiency.

If a secondary defect layer 41 acting as a gettering layer is formed near the gate electrode 17 in the active layer 13 as shown in FIG. 11, few heavy metals exist in this place. Thus, heavy metals cannot be trapped sufficiently. Moreover, if a secondary defect layer 42 is formed just above the buried oxide film 12 and in the source/drain region 21 apart from the element isolation insulating film 14, few heavy metals exist in this place, too. Thus, heavy metals cannot be trapped. When a secondary defect layer 42 is formed in that place, the following problem arises: the crystal defect constituting the secondary defect layer 42 causes a leakage current. Therefore, it is undesirable to form the secondary defect layer 42 in that place. Furthermore, when a secondary defect layer is formed outside the diffused layers serving as the source/drain layers, this contributes to the occurrence of a leakage current, which is undesirable.

As described above, since the secondary defect layers 15, 15-1 are formed near the element isolation insulating films 14 in the source/drain regions, the concentration of heavy metals acting as contaminant impurities in the active layer 13 is higher near the element isolation insulating film 14 than near the gate electrode 17.

In the embodiment, the secondary defect layers 15, 15-1 acting as the first and second gettering layers are formed near the element isolation insulating films 14 in the source/drain regions 21, 22. This enables the secondary defect layers 15, 15-1 to trap positively the heavy metals diffused from the element isolation insulating films 14 into the active layer 13. As a result, it is possible to prevent heavy metals from decreasing the reliability of the element.

In the embodiment, Si ions are implanted twice, thereby forming the secondary defect layers 15, 15-1 acting as the first and second gettering layers. The number of ion implantations is not limited to two. For instance, ion implantation may be performed three times or more. When the densify annealing temperature of the element isolation insulating film 14 is made lower, the diffusion of heavy metals into the active layer 13 decreases. In this case, the secondary defect layer 15 acting as the first gettering layer can be omitted. The omission of the secondary defect layer 15 simplifies the manufacturing processes.

Furthermore, in the embodiment, Si ions have been implanted, thereby forming the secondary defect layers 15, 15-1 acting as the first and second gettering layers. However, implanted ions are not limited to Si. For instance, Ge ions may be implanted, which produces the same effect.

In addition, the secondary defect layers acting as the gettering layers introduce the danger of a junction leakage current developing in the source/drain regions. This leakage current, however, can be prevented by making the depth xj of the junction in the source/drain regions greater than the thickness of the active layer 13. In the case of the bulk substrate, the depth xj of the source/drain regions must be made greater than the depth of the secondary defect layers. In this case, however, the secondary defect layers are so shallow that the effect of gettering cannot be expected.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor layer formed on a buried insulating layer on a semiconductor substrate;
   a plurality of element isolation insulating films which are formed in said semiconductor layer and which separate said semiconductor layer into parts;
   a gate insulating film formed on said semiconductor layer;
   a gate electrode formed on said gate insulating film;
   diffused layers serving as source/drain regions formed in said semiconductor layer on both sides of said gate electrode; and
   gettering layers formed near said element isolation insulating films in said diffused layers.

2. The semiconductor device according to claim 1, wherein said gettering layers are positioned in such a manner that they extend from the top of the buried insulating film close to the surface of said semiconductor layer.

3. The semiconductor device according to claim 1, wherein said gettering layers are a defect layers which getter contaminant impurities.

4. The semiconductor device according to claim 3, wherein the concentration of said contaminant impurities in said gettering layers is set higher than the concentration of said contaminant impurities in said semiconductor layer near said gate electrode.

5. The semiconductor device according to claim 1, wherein said gettering layers are formed apart from the gate electrode in the longitudinal direction of the channel in said source/drain regions.

6. The semiconductor device according to claim 1, wherein said buried insulating film is a thermal oxidation film and said element isolation insulating films are CVD films.

7. The semiconductor device according to claim 5, wherein said source/drain regions are in contact with said buried insulating film.

8. A semiconductor device comprising:
   an SOI substrate which includes a buried insulating film buried in a semiconductor substrate and a semiconductor layer formed on said buried insulating film;
   a plurality of element isolation insulating films which are formed in said semiconductor layer and which separate said semiconductor layer into parts; and
   MOS transistors which are formed on said semiconductor layers separated by said element isolation insulating films and each of which includes
      a gate insulating film formed on said semiconductor layer separated by said element isolation insulating films,
      a gate electrode formed on said gate insulating film; and
      diffused layers acting as source/drain regions formed in said semiconductor layer on both sides of said gate electrode; and
   gettering layers formed near said element isolation insulating layers in said diffused layers.

9. The semiconductor device according to claim 8, wherein said gettering layers are positioned in such a manner that they extend from the top of the buried insulating film close to the surface of said semiconductor layer.

10. The semiconductor device according to claim 8, wherein said gettering layers are defect layers which getter contaminant impurities.

11. The semiconductor device according to claim 10, wherein the concentration of said contaminant impurities in said gettering layers is set higher than the concentration of said contaminant impurities in said semiconductor layer near said gate electrode.

12. The semiconductor device according to claim 8, wherein said gettering layers are formed apart from the gate electrode in the longitudinal direction of the channel in said source/drain regions.

13. The semiconductor device according to claim 8, wherein said buried insulating film is a thermal oxidation film and said element isolation insulating films are CVD films.

14. The semiconductor device according to claim 12, wherein said source/drain regions are in contact with said buried insulating film.

15. A semiconductor device manufacturing method comprising:
   forming element isolation regions out of an insulating film in a semiconductor layer formed on a buried insulating layer on a semiconductor substrate;
   annealing said element isolation regions;
   forming first gettering layers by implanting ions near said element isolation regions in said semiconductor layer separated by said element isolation regions;
   forming a gate electrode insulated by a gate insulating film in a position apart from said first gettering layers on said semiconductor layer;
   forming diffused layers serving as source/drain regions by implanting impurities into said semiconductor layer on both sides of said gate electrode; and
   annealing said diffused layers and trapping contaminant impurities at said first gettering layers.

16. The semiconductor device manufacturing method according to claim 15, further comprising
   after the formation of said element isolation regions, forming second gettering layers by implanting ions near said element isolation regions in said semiconductor layer.

17. The semiconductor device manufacturing method according to claim 16, further comprising
   gettering contaminant impurities at said second gettering layers, when annealing said element isolation regions.

18. The semiconductor device manufacturing method according to claim 16, wherein said first and second gettering layers are defect layers formed by implanting Si ions.

19. The semiconductor device manufacturing method according to claim 16, wherein said first and second to gettering layers are defect layers formed by implanting Ge ions.

* * * * *